(12) United States Patent
Dawley et al.

(10) Patent No.: US 9,310,870 B2
(45) Date of Patent: Apr. 12, 2016

(54) NETWORK APPLIANCE WITH POWER CONDITIONING

(71) Applicant: Electronic Systems Protection, Inc., Knightdale, NC (US)

(72) Inventors: Robert A. Dawley, Clayton, NC (US); Richard J. Billingsley, Rossland (CA); John W. Blanke, Clayton, NC (US)

(73) Assignee: Electronic Systems Protection, Inc., Knightdale, NC (US)

( * ) Notice: Subject to any disclaimer, the term of this patent is extended or adjusted under 35 U.S.C. 154(b) by 192 days.

(21) Appl. No.: 13/970,723

(22) Filed: Aug. 20, 2013

(65) Prior Publication Data
US 2015/0058652 A1  Feb. 26, 2015

(51) Int. Cl.
| | |
|---|---|
| *H02H 3/04* | (2006.01) |
| *G06F 1/30* | (2006.01) |
| *H04L 12/26* | (2006.01) |
| *H02H 3/20* | (2006.01) |
| *H04L 12/10* | (2006.01) |
| *G01R 31/40* | (2014.01) |
| *G01R 19/165* | (2006.01) |
| *H02H 9/00* | (2006.01) |

(52) U.S. Cl.
CPC ................. *G06F 1/30* (2013.01); *H02H 3/207* (2013.01); *H04L 12/10* (2013.01); *H04L 43/08* (2013.01); *G01R 19/16547* (2013.01); *G01R 31/40* (2013.01); *H02H 3/04* (2013.01); *H02H 9/005* (2013.01)

(58) Field of Classification Search
CPC .......... H02H 9/005; H02H 9/042; H02H 9/04
USPC ................... 361/111; 340/545.3, 540, 545.4; 713/340
See application file for complete search history.

(56) References Cited

U.S. PATENT DOCUMENTS

| | | | |
|---|---|---|---|
| 6,359,270 B1* | 3/2002 | Bridson .............. G06Q 10/107 219/679 |
| 6,518,561 B1* | 2/2003 | Miura ................... G06F 1/3203 250/214 AL |
| 6,549,818 B1* | 4/2003 | Ali ........................ H05B 6/688 219/720 |
| 2004/0017911 A1* | 1/2004 | Nattkemper ............. 379/399.01 |
| 2007/0127177 A1* | 6/2007 | Benton et al. ................... 361/90 |

(Continued)

FOREIGN PATENT DOCUMENTS

EP     2555004 A1    2/2013

OTHER PUBLICATIONS

European Search Report in corresponding Application No. 14181689.2, mailed Apr. 14, 2015.

*Primary Examiner* — Thienvu Tran
*Assistant Examiner* — Angela Brooks
(74) *Attorney, Agent, or Firm* — Edell, Shapiro & Finnan LLC

(57) ABSTRACT

A network appliance apparatus conveys communication signals over a communication network and is constructed from a communication circuit and a power conditioning circuit in a common housing. The power conditioning circuit conditions alternating current (AC) electrical power and it is determined which power criteria are met by the conditioned electrical power. The conditioned electrical power is selectively provided to the communication circuit in response to one of the power criteria being met such that the conditioned electrical power is removed from the communication circuit when another of the power criteria is met.

20 Claims, 10 Drawing Sheets

(56) References Cited

U.S. PATENT DOCUMENTS

| | | |
|---|---|---|
| 2008/0144248 A1 | 6/2008 | Crawley et al. |
| 2011/0063759 A1 | 3/2011 | Billingsley et al. |
| 2012/0130658 A1* | 5/2012 | Dawley et al. .................. 702/62 |
| 2012/0194955 A1 | 8/2012 | Billingsley et al. |
| 2012/0221161 A1* | 8/2012 | Billingsley et al. ........... 700/295 |
| 2012/0265361 A1* | 10/2012 | Billingsley et al. ........... 700/295 |
| 2013/0073060 A1* | 3/2013 | Dawley et al. .................. 700/20 |
| 2013/0107041 A1* | 5/2013 | Norem et al. .................. 348/143 |
| 2014/0177737 A1* | 6/2014 | Vasquez et al. ................ 375/257 |
| 2015/0058652 A1* | 2/2015 | Dawley et al. ................. 713/340 |

* cited by examiner

NETWORK APPLIANCE WITH POWER CONDITIONING

TECHNICAL FIELD

The present disclosure relates to power conditioning in communication network node equipment.

BACKGROUND

Modern communication networks connect a wide variety of end devices, or "nodes," including computers, printers, telephones, audio/video equipment, household appliances, etc., and the list continues to grow. In addition to such end nodes, communication networks require a variety of other node devices, e.g., routers, switches, servers, etc., to carry out the conveyance of communication signals from one node device to another. Network node devices rely on steady, even power to operate properly and poor power quality, e.g., overvoltage and undervoltage, surges, transients, etc., can wreak havoc on a network. In cases where such power-related problems affect servers, routers, or switches, network communications can fail, which can be devastating to certain organizations.

As the number of different nodes connected in a network increases, so too does the number of pathways through which electrical energy surges and transients can propagate. Electrical surges and transients traverse not only power lines, but communication signal lines as well. Increasingly, organizations and individuals alike are installing equipment that limits exposure of network equipment to damaging energy carried in both power and communication signal conductors. While protective devices against short duration surges and transients are ubiquitous, many of these devices do not offer any protection against longer duration events, such as overvoltage and undervoltage conditions.

In addition to potentially damaging transients, additional measures are often taken to reduce, if not eliminate electrical noise in network equipment. Many commercially available surge protection devices include some power conditioning by which electromagnetic interference (EMI) and radio-frequency interference (RFI) are filtered from the supplied power. Typically, these devices have a plug or other terminal connection for connecting to an alternating current (AC) source and several outlets or other terminal connections at which individual load devices are connected to receive conditioned power. Certain of these power conditioning devices also include communication jacks by which communication cables can be connected through signal line surge protection and conditioning mechanisms contained within the power conditioner/surge protector. An inherent drawback of these conventional power protection devices is that the cables carrying conditioned power and communication signals from the power protection device to the network node device are once again exposed to an environment that may contain EMI/RFI sources.

Given the range of different undesirable and/or damaging power and signal conditions in communication networks and the many points of potential failure at which poor power and signal quality can adversely operate, ongoing development efforts seek ever more robust power protection and conditioning solutions to an ever-widening set of problems.

SUMMARY

A network appliance apparatus conveys communication signals over a communication network to other nodes in accordance with a network protocol and receives electrical power from an alternating current (AC) electrical power source. A communication circuit performs network communication operations on the communication signals in accordance with the network protocol and a power conditioning circuit produces conditioned electrical power from the received electrical power. A power monitor and control circuit is electrically coupled to the power conditioning circuit and analyzes the conditioned electrical power against established power criteria. The power monitor and control circuit generates a switch control signal in a signal state corresponding to each of a plurality of events that occur when the respective power criteria are met. A switch circuit electrically interposed between the power conditioning circuit and the communication circuit selectively provides the conditioned electrical power to the communication circuit in accordance with the state of the switch control signal. The communication circuit, the power conditioning circuit, the power monitor and control circuit and the switch circuit are contained in a common housing on which are disposed electrical and communication port connectors through which the electrical power and the communication signals are provided to the power conditioning circuit and the communication circuit, respectively.

DESCRIPTION OF EXAMPLE EMBODIMENTS

Figure 1:
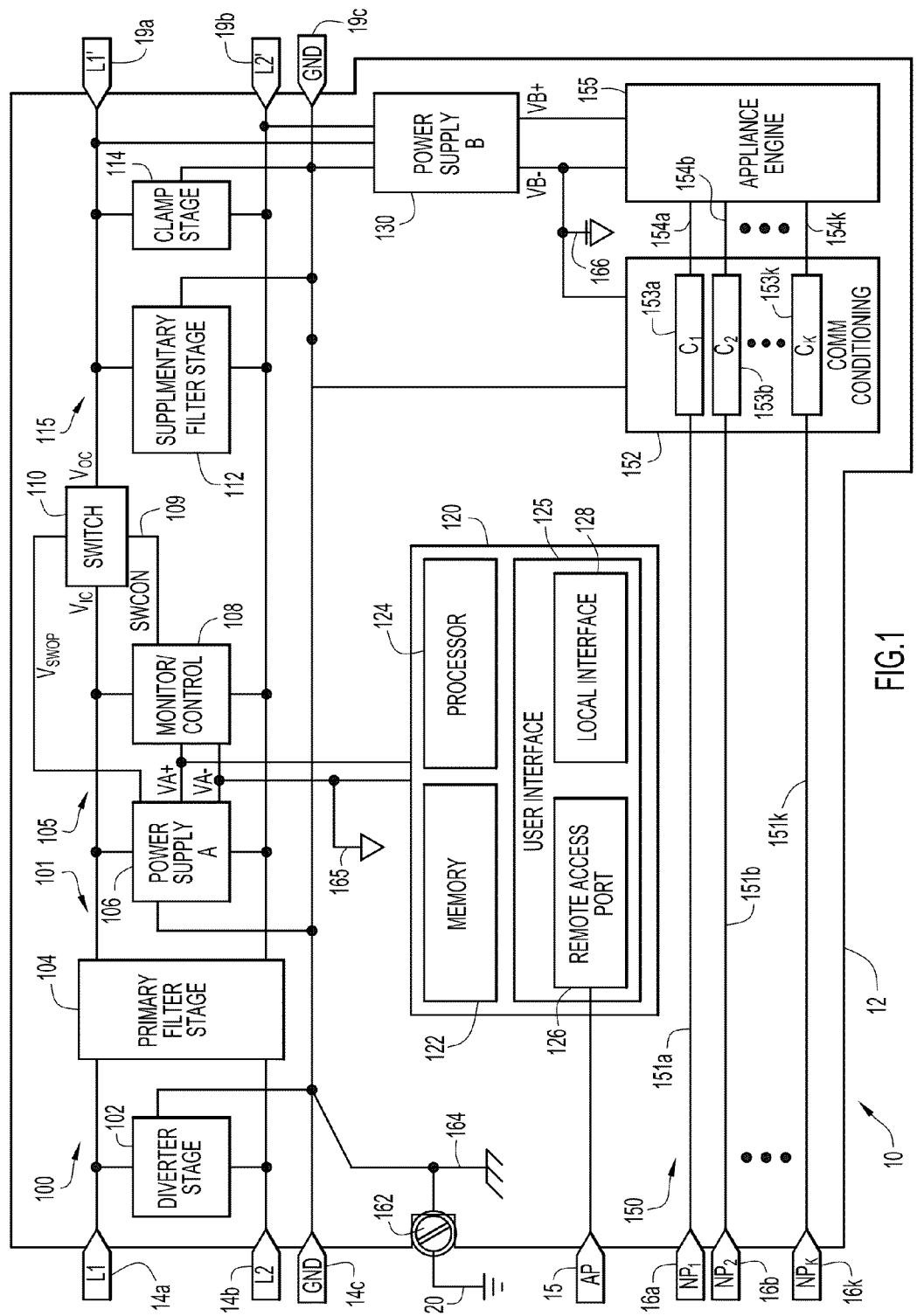
FIG. 1 is a schematic block diagram of a network node appliance by which the present general inventive concept can be embodied.

The present inventive concept is best described through certain embodiments thereof, which are described in detail herein with reference to the accompanying drawings, wherein like reference numerals refer to like features throughout. It is to be understood that the term invention, when used herein, is intended to connote the inventive concept underlying the embodiments described below and not merely the embodiments themselves. It is to be understood further that the general inventive concept is not limited to the illustrative embodiments described below and the following descriptions should be read in such light.

Additionally, the word exemplary is used herein to mean, "serving as an example, instance or illustration." Any embodiment of construction, process, design, technique, etc., designated herein as exemplary is not necessarily to be construed as preferred or advantageous over other such embodiments FIG. 1 is a schematic block diagram of an exemplary network appliance 10 by which the present invention can be embodied. Network appliance 10 may be viewed as including a power conditioning circuit 100, processing circuit 120 and a communication circuit 150, although it is to be understood that such functional partitioning is solely for purposes of explanation. That is, embodiments of the present invention may be constructed without such distinct compartmentalization illustrated in FIG. 1; technicians skilled in the power conditioning and network communications arts will recognize numerous configurations in which network appliance 10 may be realized without departing from the spirit and intended scope of the present invention.

Network appliance 10 performs specific communication operations on communication signals provided over network links to which it is coupled. As used herein, a network link is a coupling through a medium between two network nodes over which communications are conducted. A link may be formed between two nodes in air in wireless communication networks, in an optical fiber for optical networks and in a metallic conductor in wired networks. Network appliance 10 may be coupled to a plurality of different network nodes by way of separate links to each node through any of these media.

As used herein, the communication operations implemented by network appliance 10 are said to be performed by an appliance engine 155, which is constructed in suitable circuitry, including fixed analog and digital circuits, programmable logic and combinations thereof, that implements any and all signaling interfaces, signal processing, data conversion and data processing necessary to carry out communications on a communications network in accordance with one or more communication network protocols. For purposes of description and not limitation, appliance engine 155 will be described herein implementing the functionality of an Ethernet network switch and, accordingly, network appliance 10 may be alternatively referred to herein as network switch 10. When so embodied, communication signals arriving on network links connected to network switch 10 arrive at respective communication ports 154a-154k of appliance engine 155, representatively referred to herein as communication port(s) 154, are directed onto network links connected to other communication ports 154. In certain embodiments, one of communication ports 154 is dedicated by configuration in appliance engine 155 to receive and transmit communication signals on a specific link, such as one that is connected to a network from which network switch 10 is intended to branch. When so embodied, traffic between all other network nodes connected to network switch 10 and the outside network traverse that dedicated port. It is to be understood, however, that the present invention is not limited to a specific port configuration. Indeed, the present invention is not limited to particular communication operations performed by appliance engine 155, which may implement a variety of different types of network appliances including, but not limited to routers, servers, firewalls and gateways.

Appliance engine 155 may receive operating power from a power supply 130 connected to power conditioning circuit 100. The present invention is not limited to a particular implementation of power supply 130, which will be constructed to fit the needs of application engine 155 in whatever context network appliance 10 is designed to operate. In certain embodiments, power supply 130 is realized in linear- or switched-mode power supply architectures. In the illustrated embodiment, power supply 130 receives conditioned AC power from power conditioning circuit 100 and generates therefrom DC power at a potential $V_{PSB}=(VB+-VB-)$. The DC power may be provided to appliance engine 155, as illustrated in FIG. 1, although it is to be understood that the DC power from power supply 130 may be provided to circuitry throughout communication circuit 150. In certain embodiments, power supply 130 includes backup power circuits that provide power to appliance engine 155 when AC power to network appliance 10 is disrupted or when AC power is removed from power supply circuit 130 by switch circuit 110, as described below. In certain embodiments, power supply 130 includes Power over Ethernet (PoE) circuitry to generate power over network links connected to network appliance 10. When so embodied, DC power generated by power supply 130 may be used to provide PoE to network nodes connected to network switch 10 and/or used for backup power, such as by charging a backup battery (not illustrated).

Communication circuit 150 may include a communication signal conditioning circuit 152 to limit the electrical energy in the communication signals provided at communication ports 154 thereby protecting appliance engine 155 from electrical transients or surges. In certain embodiments, communication signal conditioning circuit 152 is constructed from individual signal bus conditioning circuits 153a-153k, representatively referred to herein as signal bus conditioning circuit(s) 153, each being interposed in respective signal buses 151a-151k, representatively referred to herein as signal bus(es) 151, between the corresponding communication port 154 and a corresponding one of communication port connectors 16a-16k, representatively referred to herein as communication port connector(s) 16. Communication signal conditioning circuit 152 may comprise magnetic circuits, e.g., transformers, to isolate the communication signals in link cabling between nodes from the appliance engine interface at each end of the link cabling in the linked nodes, and one or more transient voltage suppressor (TVS) circuits comprised of combinations of diodes, gas discharge tubes, and/or other elements to divert potentially damaging electrical energy away from appliance engine 155.

Figure 2A:
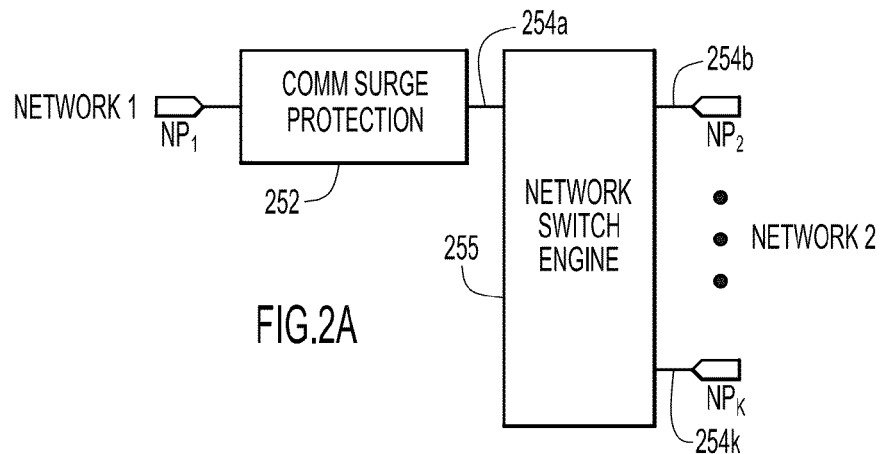
FIGS. 2A-2C are schematic block diagrams of example communication signal line protection configurations that may be implemented in embodiments of the present general inventive concept.
Figure 2B:
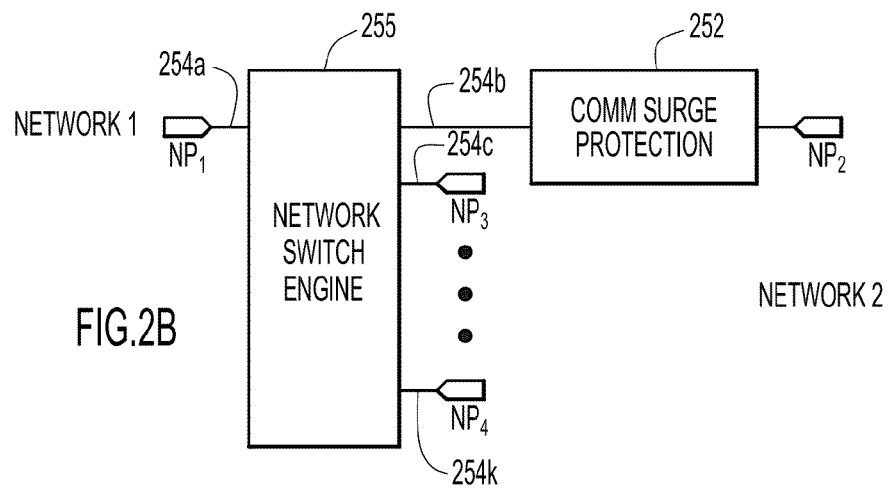
Figure 2C:
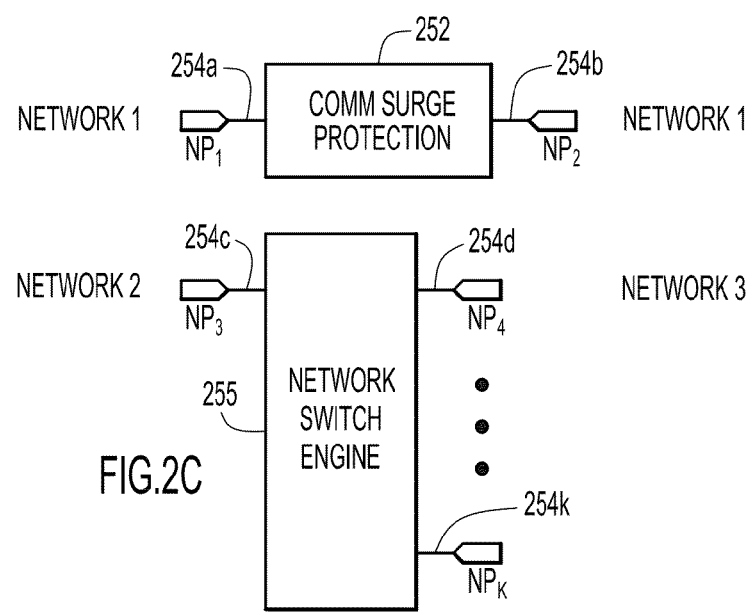

The present invention is not limited to particular circuitry implementing communication signal conditioning circuit 152. In certain embodiments, for example, isolation magnetics may be installed on all signal buses 151 and may even be incorporated in communication port connectors 16, and surge protection is provided on respective communication ports 154 as needed. When so embodied, the assignment of which communication port 154 receives surge protection may be configurable. Referring to FIGS. 2A-2C, for example, and assuming an Ethernet switch implementation, network switch engine 255 may be constructed with communication ports 254a-254k and surge protection circuit 252 may be connected to selected ones of these communication ports. In FIG. 2A, surge protection circuit 252 is provided on communication port 254a, which may be a dedicated network port for a first network with all other communication ports 254b-254k being assigned to a second network. Alternatively, surge protection may be provided on one of the communication ports of the second network, such as on communication port 254b as illustrated in FIG. 2B. In another configuration, surge protection circuit 252 may be provided in a link of a first network that is independent of network switch engine 255, as illustrated in FIG. 2C. The skilled artisan will recognize other possible configurations/topologies that can be realized in embodiments of the present invention upon review of this disclosure.

It is to be understood that the present invention can be embodied without electrical surge protection in communication circuit 150, such as when network appliance 10 is configured to communicate over optical or wireless links. In certain optical implementations, communication signal conditioning circuit 152 may include optical-to-electrical conversion circuitry, in which case power supply 130 may provide operating power to communication signal conditioning circuit 152 as well as to appliance engine 155.

Returning to FIG. 1, power conditioning circuit 100 conditions AC electrical power provided at power input port 14 comprising power terminals 14a-14c from an AC power source such as a power grid. Power is conditioned by filtering out noise, e.g., electromagnetic interference (EMI) noise and radio-frequency interference noise (RFI), diverting or dissipating high energy transients and surges, and, if necessary, disconnecting circuitry from anomalous source power. To that end, power conditioning circuit 100 may include source-end conditioning circuitry 101 comprising a diverter stage 102 and primary filter stage 104 and load-end conditioning circuitry 115 comprising supplementary filter stage 112 and clamp stage 114. Power conditioning circuit 100 may include a power output port 19 comprising power terminals 19a-19c through which equipment external to network appliance 10 can obtain conditioned AC power.

Diverter stage 102 may implement shunt energy suppression by way of suppressor components including gas discharge tubes, varistors, silicon avalanche diodes, etc., whereby the energy of normal and common mode transients is diverted to the ground or neutral conductor. In certain embodiments, diverter stage 102 may implement series energy suppression by way of suppressor components including inductors, capacitors, silicon controlled rectifiers (SCRs), triacs, metal-oxide-semiconductor field effect transistors (MOSFETs), etc., whereby the transient energy is dissipated as opposed to being shunted to the ground or neutral conductor. Circuitry suitable for this purpose is disclosed in U.S. Pat. Nos. 4,870,528 and 4,870,534, which are incorporated herein by reference in their respective entireties. Clamp circuit 114 may include suppressor components including varistors, silicon avalanche diodes, semiconductor switching components (SCRs, triacs, MOSFETs, etc.), and capacitors to provide supplemental suppression of normal and common mode transients. Primary filter stage 104 may include filter components (inductors and capacitors) to provide primary filtering of normal and common mode EMI noise. Supplementary filter stage 112 may include similar filter components to remove normal and common mode EMI noise further than that removed by primary filter stage 104. Diverter stage 102 and primary filter stage 104 of supply-side conditioning circuit 101 and supplementary filter stage 112 and clamp stage 114 of load-side conditioning circuit 115 may be constructed similar to the circuits disclosed in U.S. Pat. No. 5,136,455, for example, the disclosure of which is hereby incorporated herein by reference in its entirety.

Conditioned AC power is selectively provided to power supply 130 and externally connected load equipment through power output port 19 through switch circuit 110, the state of which being controlled by monitor/control circuit 108, as described below. In certain embodiments, switch circuit 110 is a hybrid switch, such as that described in U.S. patent application Ser. No. 12/559,027 entitled, "Hybrid Switch Circuit," which is incorporated herein by reference in its entirety. It is to be understood, however, that the present invention is not limited to any particular switch architecture, as the skilled artisan will appreciate upon review of this disclosure. Monitor/control circuit 108 may receive operating power from power supply 106, which may generate DC power at a potential $V_{PSM}=(VA+-VA-)$ from AC power at voltage $V_{IC}$. Additionally, power supply 106 may generate operating voltage $V_{SWOP}$ for switch circuit 110.

Processing circuit 120 may include a processor 124, memory 122 and a user interface 125 that, among other things, allow a user to configure various parameters of network appliance 10. For example, user interface 125 may include a remote access circuit 126, such as circuitry implementing serial bus communications or other suitable communication mechanism by which an operator can interact with network appliance 10 through a terminal device (not illustrated) connected to an access port connector 15. In one technique, the terminal device may be a computer executing software that implements various user controls by which the operator can set various power quality and network appliance parameters. User interface 125 may also include a local interface 128, such as a control panel, through which network appliance operations can be monitored and certain functionality controlled. The skilled artisan will recognize numerous local and remote interface mechanisms that can be used with the present invention without departing from the spirit and intended scope thereof and explicit description of such will be omitted for conciseness.

It is to be understood that processor circuit 120 may implement functionality that is illustrated and described herein as being realized by other circuitry. For example, processor 124 may execute processor instructions stored in memory 122 that cause processor 124 to perform various functions of monitor/control circuit 108 described below. Additionally, processor 124 may execute processor instructions in memory 122 that cause processor 124 to perform various functions of appliance engine 155.

The circuitry of network appliance 10 may be assembled on a common chassis or housed in a common housing generally illustrated at boundary 12, which will be referred to herein as housing 12. A connector implementing power input port 14 may be disposed on the exterior of housing 12 to include line voltage input terminals L1 and L2, and ground terminal GND. In certain embodiments, the connector implementing power input port 14 may be assembled at the end of a power cable. Additionally, a connector implementing a power output port 19 to include voltage output terminals L1' and L2', and ground terminal GND, may be disposed on housing 12. Communication port connectors 16 may also be disposed on housing 12, such as by suitable network connectors, e.g., RJ-45, as well as a communication port connector 15, such as by suitable serial bus connectors, e.g., RS-232 or Universal Serial Bus (USB) connectors. Other components may be accessible from outside housing 12 as well, such as control and display panel components of local interface 128.

Housing 12 may include conductive components that form a substantially equipotential surface, where such components may be metallic portions of the housing 12 itself that, among other things, provide shielding of the enclosed circuitry against EMI/RFI noise. Other embodiments, such as those whose housing 12 are constructed from non-conductive material may include a conductive element, such as a metallic strip or common connection point, to serve as this equipotential surface, which is referred to herein as chassis ground 164. Chassis ground 164 may be electrically connected to a system ground 20 at the facility in which network appliance 10 is deployed. In certain embodiments, housing 12 is constructed to be mounted in a larger structure, such as an equipment rack, and the electrical connection between chassis ground 164 and system ground 20 is achieved through a mechanical connection 162 of housing 12 with the equipment rack. Ground terminal 14c of power input port 14 may also be electrically connected to chassis ground 164 thereby grounding AC circuitry of power conditioning circuit 100. DC circuits and various portions of communication conditioning circuit 152 may be isolated from chassis ground 164 as needed. For example, the DC outputs of respective power supplies 106 and 130 may be isolated from chassis ground 164 and, in certain embodiments from each other, to maintain separate DC return paths, representatively illustrated as DC "grounds" 165 and 166. Alternatively, the negative voltage terminal of either of power supplies 106 or 130 may be connected to chassis ground 164. Communication signal conditioning circuit 152 may have certain components connected to chassis ground 164 and other components isolated from chassis ground 164 in accordance with electrical specifications of appliance engine 155. For example, the Institute for Electrical and Electronics Engineers (IEEE) standard 802.3, which standardizes Ethernet, specifies that communication port connectors 16 are to be electrically isolated from the physical layer (PHY) transceiver circuitry, which, in the illustrated embodiment, is a portion of appliance engine 155. The skilled artisan will recognize and appreciate the wide variety of grounding strategies that can be achieved by embodiments of the present invention.

Figure 3:
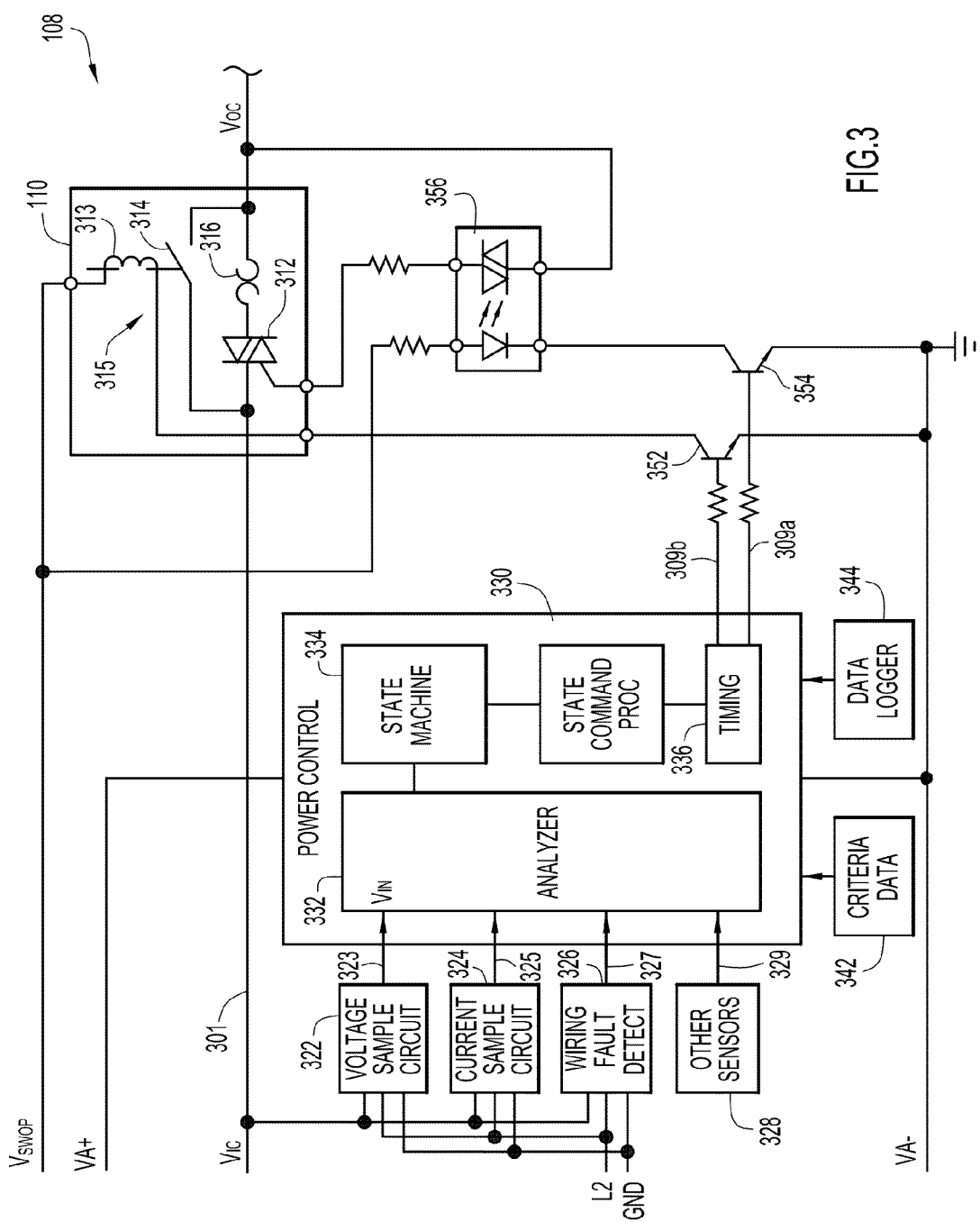
FIG. 3 is a schematic block diagram of an example monitor and control circuit and switch circuit that may be implemented in embodiments of the present general inventive concept.

Example embodiments of monitor/control circuit 108 and switch circuit 110 are illustrated in FIG. 3. In the example embodiment, switch circuit 110 is a hybrid switch having a selectively-conductive path through triac 312 and thermal limiting device 316 and another selectively-conductive path through contacts 314 of electromagnetic relay 315. Monitor/control circuit 108 may include various detector circuits and sensors that generate appropriate signals by which power control decisions can be made. For example, monitor/control circuit 108 may include a voltage sampling circuit 322 that generates a supply voltage sample signal 323 indicative of a characteristic of conditioned input voltage $V_{IC}$, a current sampling circuit 324 that generates a supply current sample signal 325 indicative of current flowing in input power conductor 301, a wiring fault detection circuit 326 that generates a wiring fault signal 327 indicative of wiring faults (e.g., reversed polarity, open ground, etc.) and other sensors 328 to generate other signals 329 indicative of various parameters, e.g., temperature. It is to be understood that voltage sampling circuit 322 and current sampling circuit 324 may be connected to other circuit components and produce other characteristic signals therefrom. For example, voltage sampling circuit 322 and current sampling circuit 324 may be connected to any line, neutral and/or ground conductor anywhere in power conditioning circuit 100. In certain embodiments, one or both of voltage sampling circuit 322 and current sampling circuit 324 may also include circuitry by which to monitor the output of power supply 106. The skilled artisan will recognize other systems and signals that can be monitored as well.

The indicating signals 323, 325, 327 and 329 may be provided to a power control processor 330 by which the signals are analyzed by analyzer 332 against various criteria stored in memory 122, representatively illustrated at criteria data storage segment 342. When one of signals 323, 325, 327 and/or 329 meet respective criteria in criteria data storage segment 342, a power quality event is said to have occurred. An indication of the power quality event may be provided to a control mechanism, such as state machine 334 that compels the appropriate action to be taken. Such action may include operating switch circuit 110 into a conducting or non-conducting state, compelling data logger 344 to record pertinent and/or user-specified information regarding the event, and so on. The present invention is not limited to any particular set of actions that can be taken upon particular power quality events occurring or to the types of power quality events that can be triggered. Additionally, it is to be understood that events other than power quality events may trigger an action, such as an over-temperature event compelling removal of power from load circuits; the discussions herein pertaining to power quality events are intended to extend to a wide variety of other events and corresponding actions, as the skilled artisan will readily appreciate upon review of this disclosure.

Figure 4:
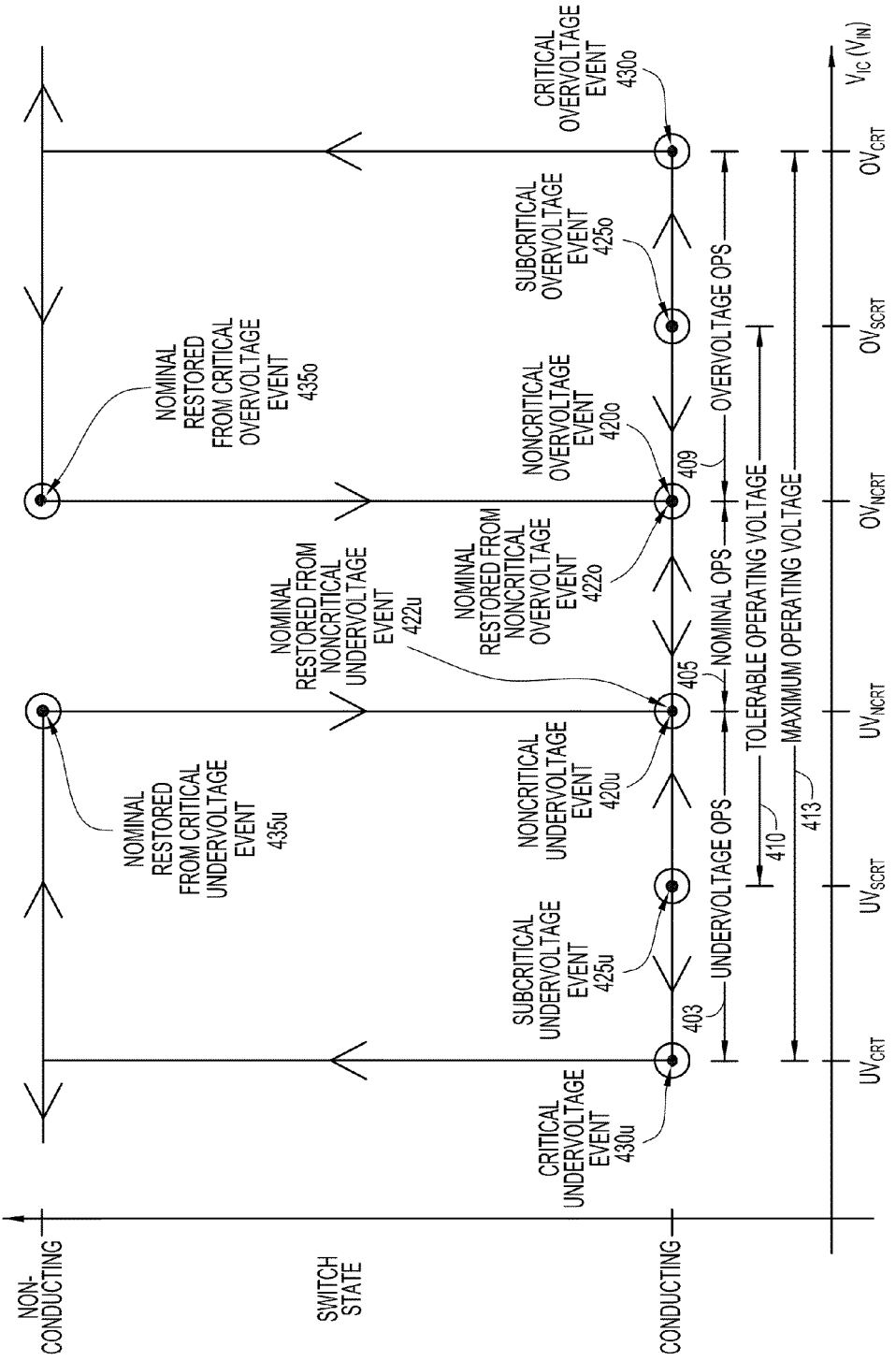
FIG. 4 is a supply voltage/switch state diagram depicting various voltage criteria and power quality events that may be triggered when such voltage criteria are met in embodiments of the present general inventive concept.
Figure 5:
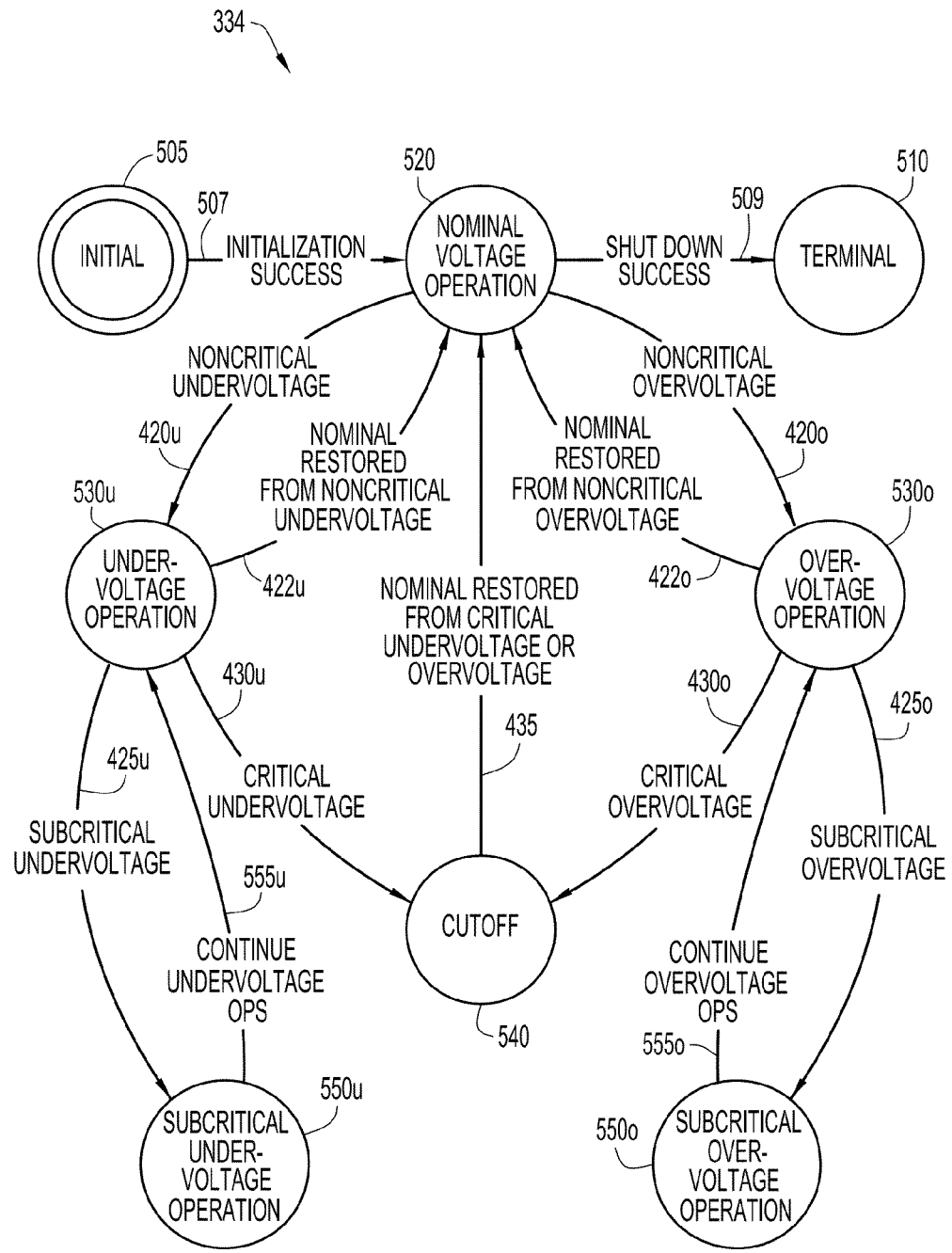
FIG. 5 is a state diagram of an example state machine that may be implemented in embodiments of the present general inventive concept.

Example operation of power control processor 330 is described with further reference to FIGS. 4 and 5. In the following example, input voltage level of conditioned input voltage $V_{IC}$ is monitored by voltage sampling circuit 322, which generates supply voltage sample signal 323, alternatively referred to herein as $V_{IN}$, and analyzer 332, which analyzes supply voltage sample signal $V_{IN}$ against various voltage threshold levels defining the operating limits/criteria on supply voltage in network appliance 10. As illustrated in FIG. 4, the operating specifications of network appliance 10 may define a nominal operating voltage range 405 over which the supply voltage is considered optimal. The operating specifications may also define some supply voltage tolerance, representatively illustrated as tolerable voltage range 410, over which network appliance 10 can still operate normally without damage being caused to the equipment except for, perhaps, a slight shortening of the expected operational lifetime of network appliance 10. In the present example, operation of network appliance 10 outside tolerable voltage range 410 may be acceptable occasionally and for short intervals, but operation under persistent voltage conditions outside tolerable voltage range 410 may result in equipment damage. Additionally, in the present example, operation of network node 10 outside a maximum voltage range 413 is prohibited.

It is to be understood that the terms "nominal," "tolerable" and "maximum" are intended solely to indicate degrees of acceptability and are not intended to convey hard limits within which network appliance 10 can be operated. As stated above, for example, operation of network appliance 10 at voltage levels outside tolerable range 410 may be "tolerable" under certain conditions.

Criteria data storage segment 342 may include data defining voltage criteria, e.g., voltage threshold levels on input voltage $V_{IC}$, as represented by supply voltage sample signal V. In certain embodiments, the voltage threshold levels may be set and modified by a user through user interface 125. When a voltage criterion is met, a power quality event occurs and in response state machine 334 changes state and an action or set of actions associated with the state is performed. In one typical configuration, the voltage threshold levels may be established to delimit the normal, tolerable and maximum operating voltage ranges described above. For example, as illustrated in FIG. 4, maximum operating voltage range 413 may be bounded between a critical undervoltage threshold $UV_{CRT}$ and a critical overvoltage threshold $OV_{CRT}$ that define, respectively, a critical undervoltage event 430u and a critical overvoltage event 430o, representatively referred to herein as critical event(s) 430. Upon an occurrence of a critical event 430, power may be removed from protected circuitry, i.e., that which is susceptible to damage, such as by compelling switch circuit 110 into a non-conducting state. Similarly, tolerable voltage range 410 may be bounded between a subcritical undervoltage threshold $UV_{SCRT}$ and a subcritical overvoltage threshold $OV_{SCRT}$ than define, respectively, a subcritical undervoltage event 425u and a subcritical overvoltage event 425o, representatively referred to herein as subcritical event(s) 425. Upon an occurrence of a subcritical event 425, protected circuitry may be allowed to operate, in which case switch circuit 110 is to be in its conducting state, but the condition of $V_{IC}$ being outside tolerable operating voltage range 410 is reported. Such reporting may include displaying a notice on user interface 125 and/or logging the event and the operating conditions surrounding the event, among other possible actions. Nominal operating voltage range 405 may be bounded by a noncritical undervoltage threshold $UV_{NCRT}$ and a noncritical overvoltage threshold $OV_{NCRT}$ that, in the present example, define separate events having different triggering conditions. For example, if supply voltage sample signal $V_{IN}$ increases or decreases to an extent that one of $UV_{NCRT}$ and $OV_{NCRT}$ is crossed from a starting voltage inside nominal operating voltage 405, a corresponding noncritical undervoltage event 420u or noncritical overvoltage event 420o, representatively referred to noncritical event(s) 420, occurs. If, on the other hand, $V_{IN}$ crosses $UV_{NCRT}$ or $OV_{NCRT}$ in the respectively opposite direction to reenter nominal operating voltage range 405, a corresponding nominal restored from undervoltage event 422u or nominal restored from overvoltage event 422o, representatively referred to herein as nominal restored from noncritical event (s) 422, occurs. If $UV_{NCRT}$ or $OV_{NCRT}$ is crossed to enter nominal operating voltage range 405 while switch circuit 110 is in a non-conducting state, i.e., subsequent to a critical event 430, a corresponding nominal restored from critical undervoltage event 435u or nominal restored from critical overvoltage event 435o, representatively referred to herein as nominal restored from critical event(s) 435, occurs. It is to be noted that by prudent placement of event boundaries, e.g., by separating critical event 430 at which switch circuit 110 is transitioned into its non-conducting state from nominal restored from critical event at which switch circuit 110 is transitioned into its conducting state, hysteresis is imposed in the threshold/event processing of analyzer 332.

Analyzer 332 may provide an indication of the occurrence of power quality events to state machine 334, which, in the present example, operates in accordance with the state diagram of FIG. 5. As stated above, each state of state machine 334 may have a particular set of actions associated therewith and exemplary processes will be described with reference to FIGS. 6-10 in conjunction with the description of FIG. 5.

State machine 334 may be placed in an initial state 505 when network appliance 10 is put into operation. While in initial state 505, network appliance 10 may initialize and begin execution of various of its processes, including an input voltage sampling process associated with supply voltage sampling circuit 322 and an input voltage monitoring and analysis process associated with analyzer 332. State machine 334 may remain in initial state 505 until an initialization success event 507, which occurs when supply voltage sample signal $V_{IN}$ is in nominal range 405. On this event, state machine 334 transitions to a nominal voltage operation state 520, which is described in paragraphs that follow. State machine 334 transitions into terminal state 510 in response to a shutdown success event 509, which occurs after an orderly shutdown of the aforementioned processes and removal of power from applicable circuits.

Figure 6:
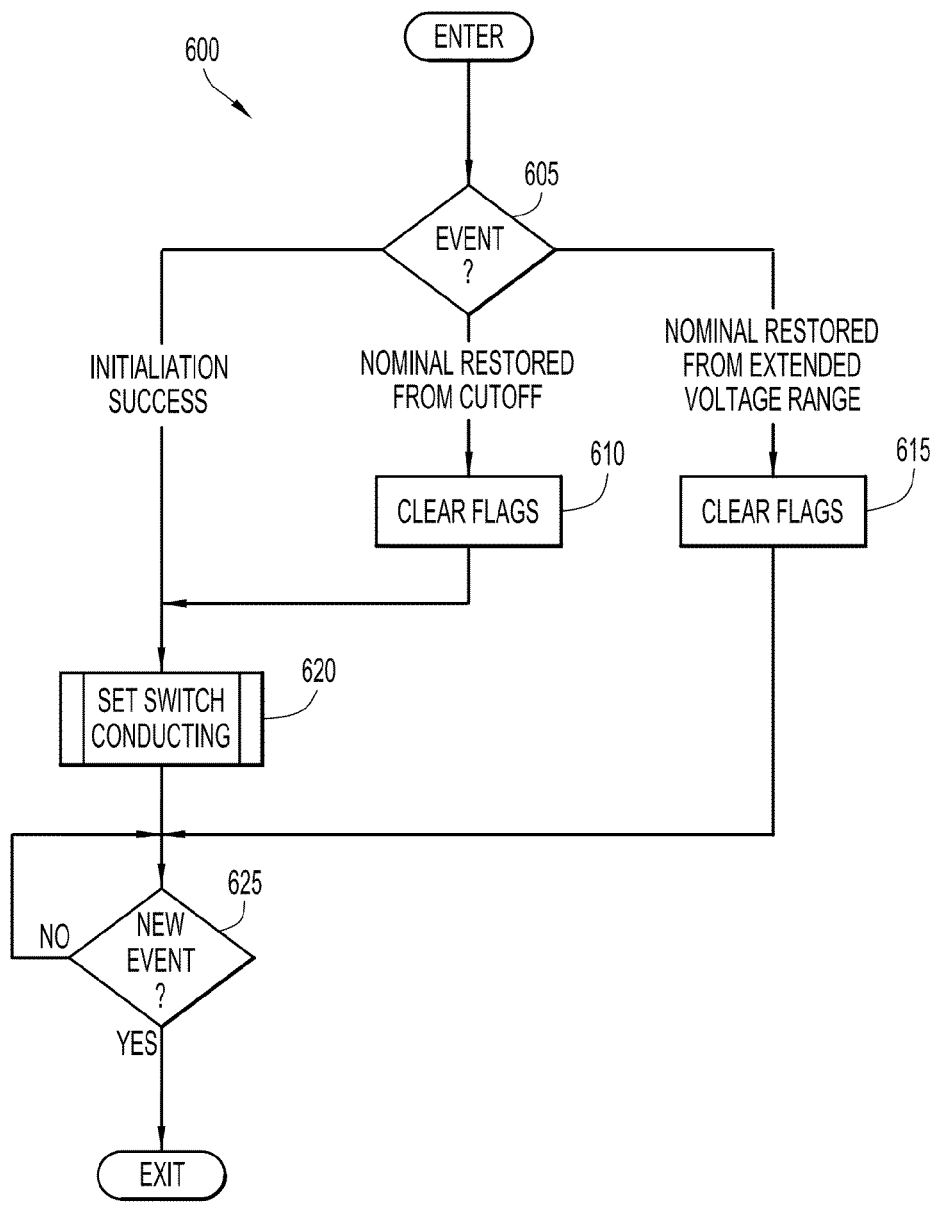
FIG. 6 is a flow diagram of an example nominal operation state process that may be executed in embodiments of the present general inventive concept.

When state machine 334 transitions to nominal voltage operation state 520, monitor/control circuit 108 may execute nominal voltage state process 600 illustrated in FIG. 6. In operation 605, the identity of the event that compelled the most recent (current) transition into nominal voltage operation state 520 is determined. If the event is identified as initialization success event 507, process 600 transitions to operation 620 which initiates a process by which switch circuit 110 is compelled into its conducting state. Such a process is exemplified by switch state transition process 700 illustrated in FIG. 7 and described below. Once control has been returned to nominal voltage state process 600 from switch state transition process 700, process 600 transitions to operation 625, at which process 600 waits until analyzer 332 generates an indication of another event. When such an event occurs, state machine 334 transitions into a different state and, accordingly, nominal voltage state process 600 is exited.

Figure 7:
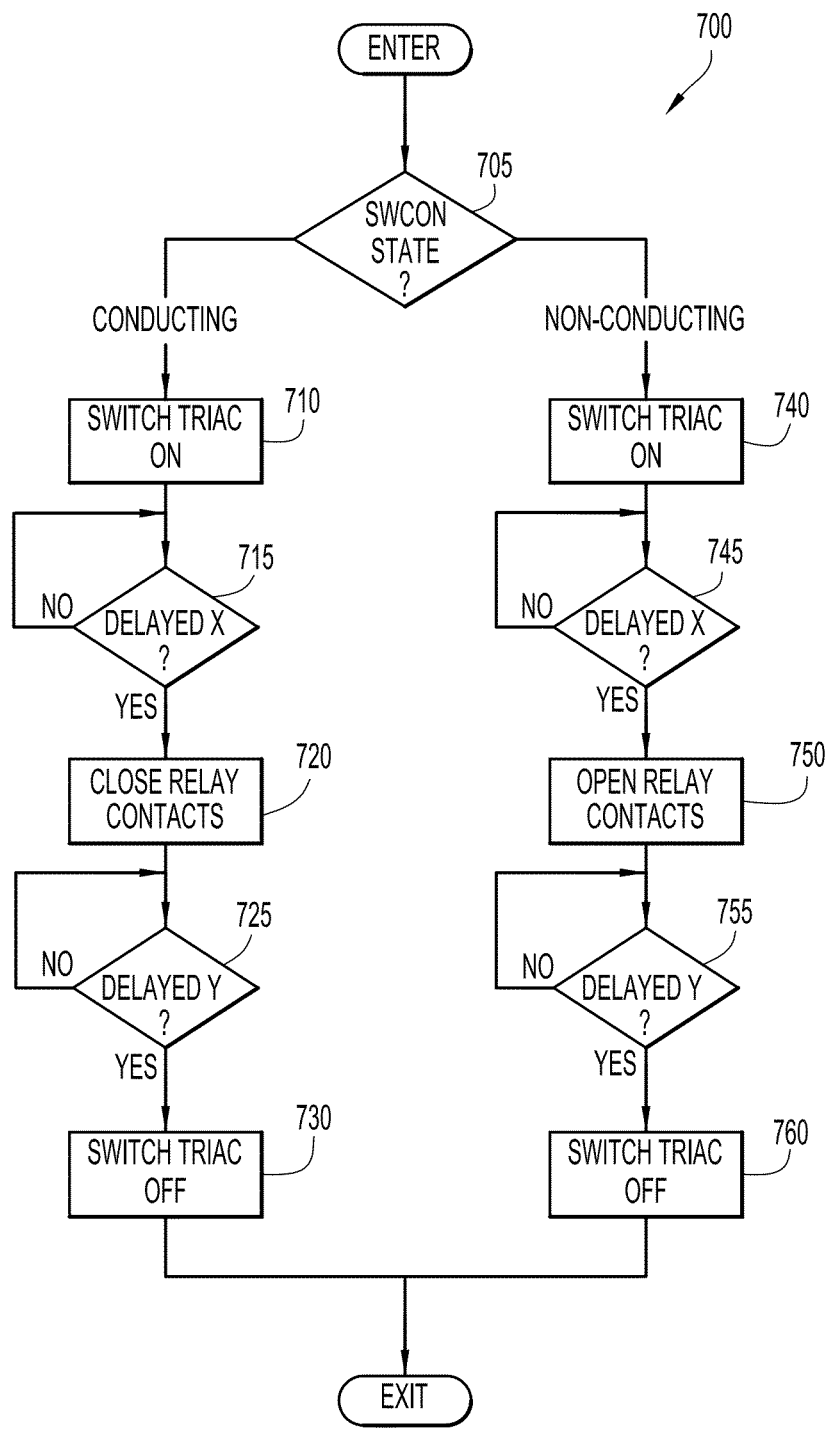
FIG. 7 is a flow diagram of an example switch state transition process that may be executed in embodiments of the present general inventive concept.

Switch state transition process 700 illustrated in FIG. 7 will now be described with further reference to FIG. 3. In operation 705, the switch state into which switch 110 is being commanded is identified. If the switch state identified in operation 705 is the conducting state, process 700 transitions into operation 710 by which triac 312 is activated into a conducting or "on" state. As illustrated in FIG. 3, state machine 334 may provide a command to timing circuit 336 to generate switch control signal 109 illustrated in FIG. 1 across separately activated control lines 309a and 309b. In response to a command to activate triac 312, timing circuit 336 may generate a signal on control line 309a that is sufficient to cause transistor 354 to conduct. Accordingly, current flows to optical coupler 356 and a corresponding gate voltage is applied to triac 312. In certain embodiments, optical coupler 356 is a zero-crossing triac driver that applies the activating gate voltage to triac 312 at a zero crossing of $V_{IC}$. Once triac 312 has been activated, switch state transition process 700 transitions to operation 715 at which process 700 waits a time X, the duration of which is controlled by timing circuit 336. When time X has elapsed, process 700 transitions to operation 720 by which relay contacts 314 are commanded to close. As illustrated in FIG. 3, when timing circuit 336 has determined that time X has elapsed, a control signal is generated and provided on control line 309b that is sufficient to cause transistor 352 to conduct. Accordingly, current flows in relay coil 313 which compels contacts 314 to close. When this has occurred, switch state transition process 700 transitions to operation 725 at which process 700 waits a time Y, the duration of which is again controlled by timing circuit 336. When time Y has elapsed, process 700 transitions to operation 730, by which triac 312 is switched to its non-conducting or "off" state. Referring to FIG. 3, such may be achieved by timing circuit 336 removing the control signal on control line 309a to cease the current flow in transistor 354 and thereby removing the gate voltage on triac 312. In this switch "closed" state, supply-side circuitry 101 and load-side circuitry 115, including power supply 130, are connected through relay contacts.

If, in operation 705, it is determined that switch 110 is to be placed in its non-conducting state, switch state transition process 700 proceeds in a manner similar to that just described. In operation 740, triac 312 is switched into its on state followed by a waiting time X in operation 745. In operation 750, relay contacts 314 are commanded to open, which may be achieved by establishing an off state in the signal in signal line 309b to terminate current flow in transistor 352 and, consequently, current flow in relay coil 313. Accordingly, relay contacts open. In operation 755, switch state transition process 700 waits for time Y, after which, in operation 760, triac 312 is switched to its off state. In this switch "opened" state, supply-side circuitry 101 and load-side circuitry 115, including power supply 130, are disconnected.

At some point, voltage sampling circuit 322 may indicate via supply voltage sample signal $V_{IN}$ that the supply voltage $V_{IC}$ has reached a level that is outside nominal voltage range 405, i.e., into either undervoltage operation voltage range 403 or overvoltage operation voltage range 409. When this occurs, analyzer 332 may provide an indication of the occurrence of a noncritical event 420, responsive to which state machine 334 transitions into a corresponding one of undervoltage operation state 530*u* or overvoltage operation state 530*o*, representatively referred to herein as extended operation state(s) 530. As discussed above, a noncritical event 420 does not necessarily indicate that input voltage $V_{IC}$ is at a level at which damage will occur and input voltage $V_{IC}$ may occasionally rise and fall in and out of nominal voltage range 405 as source power conditions change. Accordingly, in certain embodiments, extended operation state 530 may involve only minimal action, as exemplified in extended operation state process 800 in FIG. 8. In operation 805, the event causing the transition into extended operation state 530 is identified and, if the event is identified as a non-critical event, process 800 sets an appropriate undervoltage or overvoltage flag in memory. Extended operation state process 800 may then transition to operation 815 to wait for a next event. In certain embodiments, additional measures may be initiated in extended operation state 530, such as increasing the rate at which $V_{IC}$ is measured, i.e., the rate at which a new supply voltage sample $V_{IN}$ is generated and provided to analyzer 332.

If the non-nominal voltage condition is temporary and $V_{IC}$ returns to within nominal voltage range 405 without venturing outside of tolerable range 410, a corresponding nominal restored from noncritical event 422 occurs, in response to which state machine 334 transitions into nominal voltage operation state 520. As illustrated in FIG. 6, when state machine 334 enters nominal voltage operation state 520 in response to a nominal restored from noncritical event 422, as identified in operation 605, previously set flags identifying an undervoltage or overvoltage condition are cleared in operation 615 and nominal state operation process 600 transitions to operation 625 at which state machine 334 waits for a next event. Other measures previously initiated in extended operation state process 800 may also be deactivated upon return to nominal voltage operation state 520, such as by reducing the sampling rate of voltage sampling circuit 322 when such was previously increased.

Figure 8:
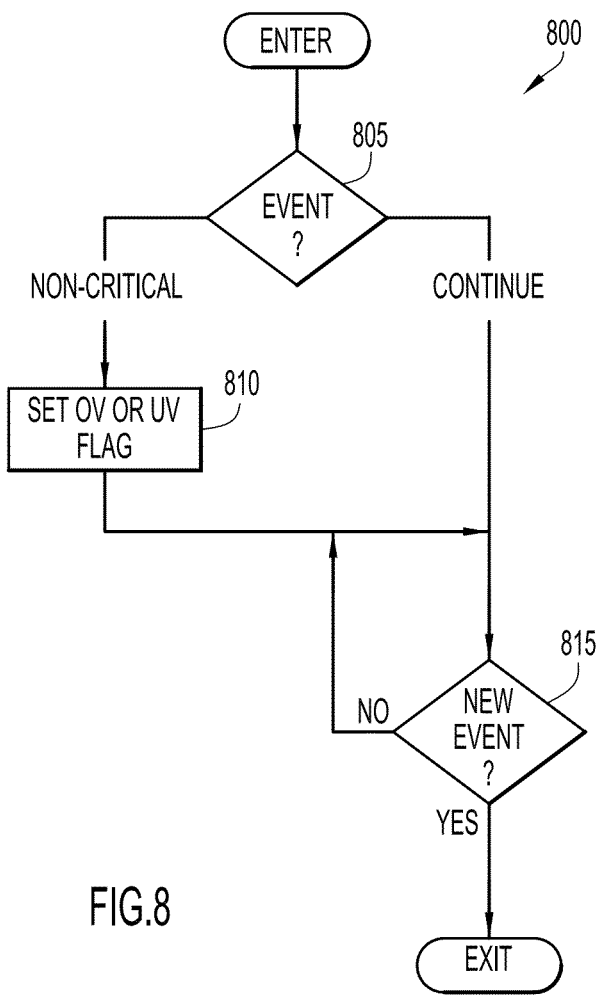
FIG. 8 is a flow diagram of an example extended operation state process that may be executed in embodiments of the present general inventive concept.
Figure 9:
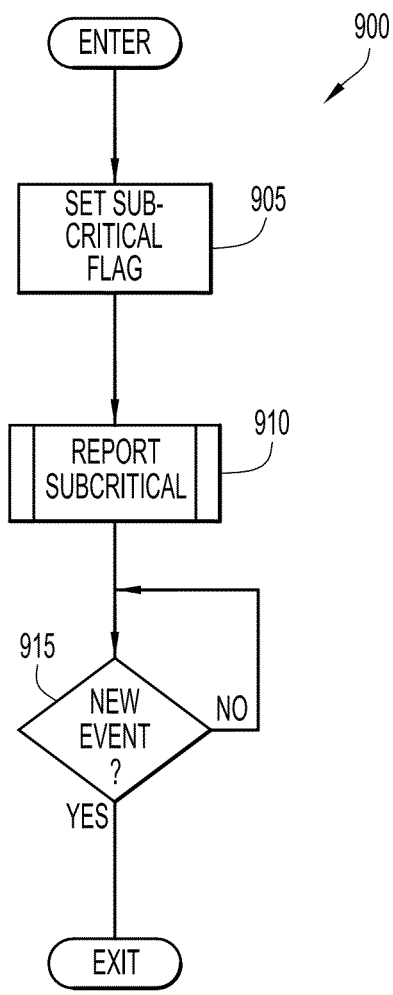
FIG. 9 is a flow diagram of an example subcritical operation state process that may be executed in embodiments of the present general inventive concept.

In certain cases, $V_{IC}$ may continue to rise or fall while state machine 334 is in an extended operation state 530 to a level outside tolerable voltage range 410. When this occurs, analyzer 332 may indicate an occurrence of the appropriate subcritical event 425 and, in response, state machine 334 may transition into the corresponding subcritical undervoltage operation state 550*u* or subcritical overvoltage operation state 550*o*, representatively referred to herein as subcritical operation state(s) 550. Upon transitioning into subcritical operation state 550, monitor/control circuit 108 may execute subcritical operation state process 900 illustrated in FIG. 9. In operation 905, a subcritical event flag may be set and in operation 910, a reporting process may be executed that gives notice that the subcritical event occurred. The present invention is not limited to any specific reporting implementation, which may include visual/audible annunciation, data logging by data logger 344, formatting and sending alert messages over a suitable message conveyance system, such as email or cellular text message. Upon return to subcritical operation state process 900 from the reporting process, process 900 may transition to operation 915 where state machine 334 awaits a next event. In certain embodiments, monitor/control circuit 108 may allow undervoltage or overvoltage operations to continue, in which case an appropriate continue undervoltage operations event 555*u* or continue overvoltage operations event 555*o*, representatively referred to herein as continue extended operations event(s) 555, occurs. In response, state machine 334 transitions back into extended operation state 530 and extended operation state process 800 is executed, where the continue extended operations event 555 is identified in operation 805. In certain embodiments, as illustrated in FIG. 8, no action other than reporting is taken following a subcritical event 425 and extended operation state process 800 simply transitions into operation 815 to await a subsequent event. It is to be noted that no change of state of switch circuit 110 has been commanded as a result of a subcritical event 425; switch circuit 110 thus remains in its conducting or closed state.

Figure 10:
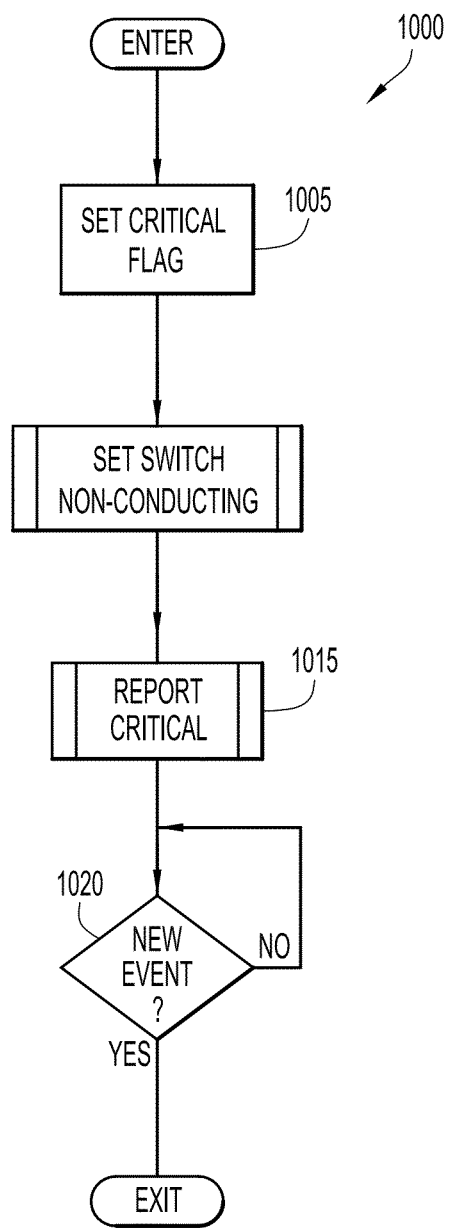
FIG. 10 is a flow diagram of an example cutoff state process that may be executed in embodiments of the present general inventive concept.

If $V_{IC}$ continues to increase or decrease beyond maximum operating voltage range 413, analyzer 332 may generate and provide an indication that a critical event 430 has occurred in response to which state machine 334 may transition into cutoff state 540. An exemplary cutoff state process 1000 is illustrated in FIG. 10 where, in operation 1005, a critical event flag may be set. In operation 1010, switch state transition process 700 is executed to compel switch circuit 110 into its non-conducting or open state as described above. In operation 1015, the cutoff process may be reported in a manner similar to the subcritical event reporting. In operation 1020, state machine 334 waits for another event and, as such, remains in cutoff state 540 until analyzer 332 generates and provides a nominal restored from critical event 435. In response, state machine 334 transitions to nominal voltage operation state 520 and, once again, nominal operation state process 600 is executed. In this case, operation 605 identifies the event as restored from critical event and process 600 transitions to operation 610, whereby power quality event flags are cleared. In operation 620, switch state process 700 is initiated to set switch circuit 110 into is conducting state and, in operation 625, state machine 334 awaits another event while remaining in nominal operation state 520.

Certain embodiments of the present general inventive concept provide for the functional components to be manufactured, transported, marketed and/or sold as processor instructions encoded on computer-readable media. The present general inventive concept, when so embodied, can be practiced regardless of the processing platform on which the processor instructions are executed and regardless of the manner by which the processor instructions are encoded on the computer-readable medium.

It is to be understood that the computer-readable medium described above may be any non-transitory medium on which the instructions may be encoded and then subsequently retrieved, decoded and executed by a processor, including electrical, magnetic and optical storage devices. Examples of non-transitory computer-readable recording media include, but are not limited to, read-only memory (ROM), random-access memory (RAM), and other electrical storage; CD-ROM, DVD, and other optical storage; and magnetic tape, floppy disks, hard disks and other magnetic storage. The processor instructions may be derived from algorithmic constructions in various programming languages that realize the present general inventive concept as exemplified by the embodiments described above.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalents.

What is claimed is:

1. A network appliance apparatus to convey communication signals over a communication network to other nodes thereof in accordance with a network protocol, the network node appliance receiving electrical power from an alternating current (AC) electrical power source, the network node appliance comprising:
   a communication circuit to perform network communication operations on the communication signals in accordance with the network protocol;
   a power conditioning circuit to produce conditioned electrical power from the received electrical power;
   a power monitor and control circuit electrically coupled to the power conditioning circuit to analyze the conditioned electrical power against established power criteria and to generate a switch control signal in a signal state corresponding to each of a plurality of events that occur when the respective power criteria are met;
   a switch circuit electrically interposed between the power conditioning circuit and the communication circuit to selectively provide the conditioned electrical power to the communication circuit in accordance with the state of the switch control signal; and
   a housing enclosing the communication circuit, the power conditioning circuit, the power monitor and control circuit and the switch circuit and having disposed thereon electrical and communication port connectors through which the electrical power and the communication signals are provided to the power conditioning circuit and the communication circuit, respectively.

2. The network appliance apparatus of claim 1, wherein the communication circuit comprises:
   a communication signal conditioning circuit electrically coupled to at least one of the communication port connectors to produce a conditioned communication signal.

3. The network appliance apparatus of claim 2, wherein the communication signal conditioning circuit includes an electrical surge protection circuit electrically interposed between two of the communication port connectors.

4. The network appliance apparatus of claim 2, wherein the communication circuit comprises:
   a network appliance engine to perform the network communication operations on the communication signals in accordance with the network protocol; and, wherein
   the communication signal conditioning circuit includes an electrical surge protection circuit that is electrically coupled to the at least one of the communication port connectors and to a corresponding at least one of a plurality of communication ports of the network appliance engine.

5. The network appliance apparatus of claim 4, wherein the at least one of the communication ports is configured for communications over a predetermined communication network link and the communication port connectors corresponding to any of the communication ports other than those configured for the predetermined network link are excluded from electrical coupling to the electrical surge protection circuit.

6. The network appliance apparatus of claim 4, wherein the electrical surge protection circuit is electrically coupled to all of the communication ports of the network appliance engine and the corresponding communication port connectors disposed on the housing.

7. The network appliance apparatus of claim 1, wherein the communication circuit includes a direct current (DC) power supply to generate DC power at output terminals thereof from the conditioned electrical power selectively provided at AC terminals thereof through the switch circuit.

8. The network appliance apparatus of claim 1 further comprising:
   a chassis ground conductor electrically connected to the housing and to a ground terminal of the electrical port connector.

9. The network appliance apparatus of claim 1, wherein the power conditioning circuit comprises:
   a diverter circuit connected to a line terminal of the electrical port connector on a supply side of the switch circuit at which the electrical port connector is coupled to the power conditioning circuit;
   a primary filter circuit connected to the line terminal of the electrical port connector and to a line conductor on the supply side of the switch circuit;
   a supplementary filter circuit connected to a line conductor on a load side of the switch circuit at which the communication circuit is coupled to the power conditioning circuit; and
   a clamp circuit connected to the line conductor on the load side of the switch circuit.

10. The network appliance circuit of claim 9, wherein the diverter circuit is excluded from a connection to the chassis ground conductor such that electrical energy in excess of a predetermined amount in the line conductor on the supply side of the switch circuit is dissipated in the diverter circuit.

11. The network appliance apparatus of claim 1, further comprising:
   an electrical output port connector disposed on the housing and electrically connected to the switch circuit in parallel with the communication circuit to provide the conditioned electrical power to external load equipment.

12. The network appliance apparatus of claim 1, wherein the communication circuit comprises:
   an electrical surge suppression circuit electrically connected to a communication signal bus and to at least one of the communication port connectors.

13. The network appliance apparatus of claim 1, wherein the power monitor and control circuit generates the switch control signal in an on state that compels the switch circuit into a conducting state responsive to the conditioned electrical power meeting a first power quality criterion and generating the switch control signal in an off state that compels the switch circuit into a non-conducting state responsive to the conditioned electrical power meeting a second power quality criterion.

14. The network appliance apparatus of claim 13, wherein the first power quality criterion is met when measured voltage of the conditioned electrical power is between a nominal upper voltage threshold and a nominal lower voltage threshold and the second power criterion is met when the measured voltage of the conditioned electrical power exceeds a critical upper voltage threshold that is higher than the nominal upper voltage threshold or when the input voltage of the conditioned electrical power is below a critical lower voltage threshold that is lower than the nominal lower voltage threshold.

15. The network appliance apparatus of claim 14 further comprising:

a data logger to record power quality event data in response to third or fourth power quality criteria being met, wherein the third power quality criterion is met when the measured voltage of the conditioned electrical power exceeds a subcritical upper voltage threshold that is higher than the nominal upper voltage threshold and below the critical upper voltage threshold and the fourth power quality criterion is met when the measured voltage of the conditioned electrical power is below a subcritical lower voltage threshold that is lower than the nominal lower voltage threshold and higher than the critical lower voltage threshold.

16. The network appliance apparatus of claim 15, wherein the power monitor and control circuit generates the switch control signal in the on state that compels the switch circuit into the conducting state when either the third or fourth power quality criteria is met.

17. A method of conditioning alternating current (AC) electrical power in a network appliance apparatus that conveys communication signals over a communication network by a communication circuit contained in a housing, the method comprising:
  receiving the electrical power from an AC electrical power source through an electrical port connector in the housing;
  conditioning the received electrical power within the housing;
  determining within the housing which of established power criteria are met by the conditioned electrical power; and
  selectively providing within the housing the conditioned electrical power to the communication circuit in response to one of the power criteria being met such that the conditioned electrical power is removed from the communication circuit when another of the power criteria is met.

18. The method of claim 17 further comprising: conditioning at least one of the communication signals within the housing.

19. The method of claim 17 further comprising: selectively providing the conditioned electrical power to a load external to the housing in parallel with providing the conditioned electrical power to the communication circuit in response to the one of the power criteria being met such that the conditioned electrical power is removed from the load when the other of the power criteria is met.

20. A tangible, non-transitory computer-readable medium having encoded thereon processor instructions that, when executed by a processor in a network appliance apparatus that conveys communication signals over a communication network by a communication circuit contained in a housing, configures the processor to perform:
  determining within the housing which of established power criteria are met by conditioned electrical power produced by a power conditioning circuit within the housing from alternating current (AC) electrical power received through an electrical port connector in the housing; and
  selectively providing within the housing the conditioned electrical power to the communication circuit in response to one of the power criteria being met such that the conditioned electrical power is removed from the communication circuit when another of the power criteria is met.

* * * * *